(12) United States Patent
Huang et al.

(10) Patent No.: US 12,433,142 B2
(45) Date of Patent: Sep. 30, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Yudiao Cheng, Beijing (CN); Weiyun Huang, Beijing (CN); Yue Long, Beijing (CN); Yuanyou Qiu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 467 days.

(21) Appl. No.: 17/772,559

(22) PCT Filed: May 17, 2021

(86) PCT No.: PCT/CN2021/094032
§ 371 (c)(1),
(2) Date: Apr. 28, 2022

(87) PCT Pub. No.: WO2021/258911
PCT Pub. Date: Dec. 30, 2021

(65) Prior Publication Data
US 2022/0376029 A1    Nov. 24, 2022

(30) Foreign Application Priority Data

Jun. 22, 2020 (CN) .......................... 202010574224.9

(51) Int. Cl.
     *H10K 59/88*      (2023.01)
     *H10K 59/121*      (2023.01)
     (Continued)

(52) U.S. Cl.
     CPC .......... *H10K 59/88* (2023.02); *H10K 59/1213* (2023.02); *H10K 59/131* (2023.02); *H10K 59/65* (2023.02)

(58) Field of Classification Search
CPC ..... H01L 33/00–648; H01L 27/15–156; H01L 2933/00–0091; H10K 50/844;
(Continued)

(56) References Cited

U.S. PATENT DOCUMENTS 10,768,883 B2    9/2020    Jeong
11,362,146 B2    6/2022    Lou et al.
(Continued)

FOREIGN PATENT DOCUMENTS

CN    106409249 A    2/2017
CN    109541865 A    3/2019
(Continued)

OTHER PUBLICATIONS

European Search Report for corresponding European Application No. 21828244.0, dated May 30, 2023.
(Continued)

Primary Examiner — Dao H Nguyen
(74) Attorney, Agent, or Firm — LEASON ELLIS LLP

(57) ABSTRACT

A display substrate and a display device are provided. The display substrate includes a display region; the display region includes a first display region and a second display region; the first display region includes at least one first light-emitting element, and the first display region allows light from the first side to be at least partially transmitted to the second side; the second display region includes at least (Continued)

one first pixel circuit, and the first light-emitting element is electrically connected with the first pixel circuit; the display substrate is provided with at least one signal transmission line and at least one first dummy wire; an orthographic projection of the first dummy wire on a plane parallel to the display substrate and an orthographic projection of the signal transmission line on the plane parallel to the display substrate are at least partially staggered.

20 Claims, 6 Drawing Sheets

(51) Int. Cl.
*H10K 59/131* (2023.01)
*H10K 59/65* (2023.01)

(58) Field of Classification Search
CPC ........... H10K 50/00–87; H10K 59/131; H10K 59/122; H10K 59/123; H10K 59/80–8794; H10K 59/12–1315; H10K 2102/311; H10K 70/00; H10K 71/00–441; H10K 30/865; H10K 2101/10; H10K 2101/40; H10K 85/00–761; H10K 77/10; H10K 59/88; H10K 59/1213; H10K 59/54; H10K 59/121; H05B 33/02; H05B 33/04; H05B 33/06; H05B 33/10; H05B 33/22; G09F 9/335
See application file for complete search history.

(56) References Cited

U.S. PATENT DOCUMENTS

| | | | |
|---|---|---|---|
| 11,387,295 | B2 | 7/2022 | Zhong et al. |
| 2018/0026080 | A1 | 1/2018 | Lee et al. |
| 2020/0105843 | A1* | 4/2020 | Baek ..................... H10K 59/131 |
| 2020/0357875 | A1* | 11/2020 | Wang ................... H10K 59/121 |
| 2021/0357072 | A1 | 11/2021 | Zheng |
| 2022/0115462 | A1 | 4/2022 | Jung et al. |
| 2022/0320251 | A1* | 10/2022 | Cai ..................... H10K 59/1213 |
| 2022/0399416 | A1* | 12/2022 | Han ..................... H10K 59/873 |
| 2023/0413628 | A1* | 12/2023 | Yoon ....................... G06F 1/189 |

FOREIGN PATENT DOCUMENTS

| | | | |
|---|---|---|---|
| CN | 109599404 | A | 4/2019 |
| CN | 110060578 | A | 7/2019 |
| CN | 110310977 | A | 10/2019 |
| CN | 110491917 | A | 11/2019 |
| CN | 110504289 | A | 11/2019 |
| CN | 110767714 | A | 2/2020 |
| CN | 110874990 | A | 3/2020 |
| CN | 110911440 | A | 3/2020 |
| CN | 111048005 | A | 4/2020 |
| CN | 210429820 | U | 4/2020 |
| JP | 06052990 | A | 2/1994 |
| JP | 2005031645 | A | 2/2005 |
| JP | 2008252082 | A | 10/2008 |
| JP | 2011095524 | A | 5/2011 |
| JP | 2018189965 | A | 11/2018 |

OTHER PUBLICATIONS

Japanese Office Action cited in corresponding Japanese Application No. 2022-533553, dated Mar. 5, 2025.

* cited by examiner

DISPLAY SUBSTRATE AND DISPLAY DEVICE

CROSS-REFERENCE TO RELATED PATENT APPLICATIONS

This application is a U.S. National Stage Application under 35 U.S.C. § 371 of International Patent Application No. PCT/CN2021/094032 filed May 17, 2021, which claims the benefit of priority of Chinese Patent Application No. 202010574224.9 filed Jun. 22, 2020, both of which are incorporated by reference in their entireties. The International Application was published on Dec. 30, 2021, as International Publication No. WO 2021/258911 A1.

TECHNICAL FIELD

Embodiments of the present disclosure relate to a display substrate and a display device.

BACKGROUND

Organic Light-Emitting Diode (OLED) display devices have characteristics such as wide viewing angle, high contrast ratio, fast response speed, wide color gamut, high screen-to-body ratio, self-luminescence, thinness and lightness. Due to the above-described characteristics and advantages, the OLED display devices have gradually attracted widespread attention and may be applied to mobile phones, monitors, tablet personal computers, smart watches, digital cameras, instruments and meters, flexible wearable apparatuses and other apparatuses having a display function. With further development of display technology, the display device having high screen-to-body ratio cannot meet people's requirement any more, and the display device having a full screen becomes a development trend of display technology in the future.

SUMMARY

At least one embodiment of the present disclose, it provides a display substrate, the display substrate having a first side for display and a second side opposite to the first side and comprising a display region; the display region comprises a first display region and a second display region; the second display region at least partially surrounds the first display region; and the first display region and the second display region do not overlap with each other; the first display region comprises at least one first light-emitting element, and the first display region allows light from the first side to be at least partially transmitted to the second side; the second display region comprises at least one first pixel circuit, and the first light-emitting element is electrically connected with the first pixel circuit; the display substrate is provided with at least one signal transmission line and at least one first dummy wire; at least portion of the signal transmission line is located in the first display region and the second display region, and the first light-emitting element is connected with the first pixel circuit through the signal transmission line, at least portion of the first dummy wire is located in the first display region and is insulated from the signal transmission line and the first light-emitting element, the signal transmission line and the first dummy wire respectively extend along a first direction; and an orthographic projection of the first dummy wire on a plane parallel to the display substrate and an orthographic projection of the signal transmission line on the plane parallel to the display substrate are at least partially staggered.

For example, in the display substrate provided by an embodiment of the present disclosure, the first dummy wire and the signal transmission line are located in a same layer.

For example, in the display substrate provided by an embodiment of the present disclosure, the first dummy wire and the signal transmission line both extend along a straight line and are parallel to each other.

For example, in the display substrate provided by an embodiment of the present disclosure, the at least one first dummy wire comprises a plurality of first dummy wires; and the plurality of first dummy wires are arranged along a second direction different from the first direction and are configured to receive a first voltage signal, the display substrate further comprises at least one second dummy wire, the second dummy wire extends along the second direction and is electrically connected with the plurality of first dummy wires, so that the plurality of first dummy wires are electrically connected with each other to receive the first voltage signal.

For example, in the display substrate provided by an embodiment of the present disclosure, at least one of the plurality of first dummy wires is electrically connected with a first power line through a via hole structure, and the first power line is configured to supply the first voltage signal.

For example, in the display substrate provided by an embodiment of the present disclosure, the second dummy wire and the first dummy wire are located in a same layer, or the second dummy wire and the first dummy wire are located in different film layers, and the different film layers are insulated from each other at a position where no via hole is provided.

For example, in the display substrate provided by an embodiment of the present disclosure, the at least one signal transmission line comprises a plurality of signal transmission lines arranged along the second direction, the plurality of signal transmission lines and the plurality of first dummy wires constitute a wiring array; one of the plurality of signal transmission lines serves as a line unit in the wiring array, and one of the plurality of first dummy wires serves as a line unit in the wiring array; and distances from at least one line unit in the wiring array to two adjacent line units respectively in the second direction are equal.

For example, in the display substrate provided by an embodiment of the present disclosure, the first display region comprises a middle region and a peripheral region located on both sides of the middle region in the first direction, a central axis of the first display region is located in the middle region, and the peripheral region is adjacent to the second display region; a per unit area distribution ratio of the plurality of first dummy wires in the middle region is greater than a per unit area distribution ratio of the plurality of first dummy wires in the peripheral region.

For example, in the display substrate provided by an embodiment of the present disclosure, the signal transmission line, the first dummy wire and the second dummy wire each includes a transparent electrically conductive wire.

For example, in the display substrate provided by an embodiment of the present disclosure, a width of the first dummy wire in a second direction different from the first direction is equal to a width of the signal transmission line in the second direction.

For example, in the display substrate provided by an embodiment of the present disclosure, the signal transmission line is electrically connected with an anode of the first light-emitting element through a via hole structure, and the via hole structure at least penetrates through an insulating layer located between the signal transmission line and the anode of the first light-emitting element.

For example, in the display substrate provided by an embodiment of the present disclosure, an orthographic projection of the via hole structure on the plane parallel to the display substrate and an orthographic projection of the at least one first dummy wire on the plane parallel to the display substrate do not overlap with each other.

For example, in the display substrate provided by an embodiment of the present disclosure, the first pixel circuit comprises a thin film transistor, and the thin film transistor comprises a gate electrode, a first electrode and a second electrode, the signal transmission line is electrically connected with the first electrode or the second electrode of the thin film transistor.

For example, the display substrate provided by an embodiment of the present disclosure further comprises a source-drain metal layer, the first electrode and the second electrode of the thin film transistor are located in the source-drain metal layer; and the anode of the first light-emitting element is located above the source-drain metal layer, a film layer where the signal transmission line and the first dummy wire are located is located between the anode of the first light-emitting element and the source-drain metal layer.

For example, in the display substrate provided by an embodiment of the present disclosure, the display region further comprises a third display region, the third display region at least partially surrounds the second display region; the first display region, the second display region and the third display region do not overlap with each other; the second display region further includes at least one second light-emitting element and at least one second pixel circuit; the second light-emitting element is electrically connected with the second pixel circuit; the third display region includes at least one third light-emitting element and at least one third pixel circuit; and the third light-emitting element is electrically connected with the third pixel circuit.

For example, in the display substrate provided by an embodiment of the present disclosure, the first light-emitting element, the second light-emitting element and the third light-emitting element each comprises an organic light emitting diode.

For example, in the display substrate provided by an embodiment of the present disclosure, the at least one first light-emitting element comprises a plurality of first light-emitting elements; the at least one second light-emitting element comprises a plurality of second light-emitting elements; and the at least one third light-emitting element comprises a plurality of third light-emitting elements, a per unit area distribution ratio of the plurality of first light-emitting elements in the first display region is less than or equal to a per unit area distribution ratio of the plurality of second light-emitting elements in the second display region; a per unit area distribution ratio of the plurality of second light-emitting elements in the second display region is less than a per unit area distribution ratio of the plurality of third light-emitting elements in the third display region.

For example, in the display substrate provided by an embodiment of the present disclosure, the first display region has a region that is covered by the orthographic projection of the signal transmission line on the plane parallel to the display substrate and covered by the orthographic projection of the first dummy wire on the plane parallel to the display substrate, a ratio of an area of the region to an area of the first display region is 70% to 95%.

At least one embodiment of the present disclosure further provides a display device, the display device comprises the display substrate provided by any one of embodiments of the present disclosure.

For example, the display substrate provided by an embodiment of the present disclosure, further comprising a sensor, the sensor is located on the second side of the display substrate and is configured to receive light from the first side of the display substrate.

For example, in the display substrate provided by an embodiment of the present disclosure, an orthographic projection of the sensor on the display substrate at least partially overlaps with the first display region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
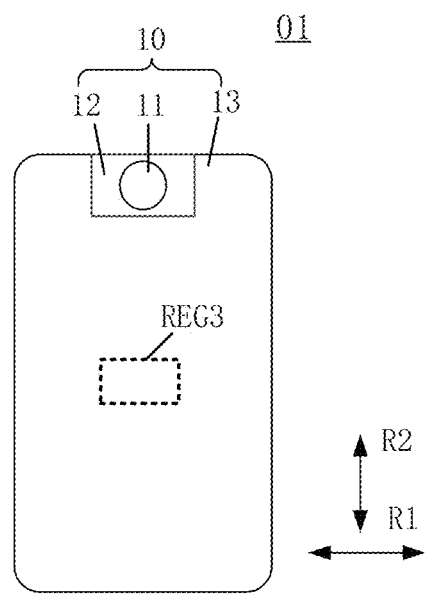
FIG. 1 is a schematic plan view of a display substrate provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With respect to current display substrate having an under-screen sensor (e.g., camera), the Pixels Per Inch (PPI) of light-emitting elements of a display region corresponding to the under-screen sensor is less than the per unit area distribution ratio of light-emitting elements in other display regions of the display substrate, in order to improve the light transmittance of the display region corresponding to the under-screen sensor.

However, since different regions on the display substrate have different PPI of light-emitting elements, arrangement modes of the light-emitting elements and corresponding pixel circuits are various in different regions. For example, light-emitting elements of the display region corresponding to the under-screen sensor need to be electrically connected with corresponding pixel circuits located in other display regions, so that it is difficult to implement uniform arrangement of wires in the display region corresponding to the under-screen sensor. This will affect light transmittance of the display region corresponding to the under-screen sensor, for example, reduce uniformity of light passing through the region, which in turn causes the under-screen sensor to be prone to have problems such as light reflection when receiving light, and difficult to accurately implement operations such as image capture, distance sensing, and light intensity sensing, thereby rendering adverse effects on performance of the display device adopting the display substrate.

At least one embodiment of the present disclosure provides a display substrate; the display substrate has a first side for display and a second side opposite to the first side, and includes a display region; the display region includes a first display region and a second display region, the second display region at least partially surrounds the first display region, the first display region and the second display region do not overlap with each other. The first display region includes at least one first light-emitting element, and the first display region allows light from the first side to be at least partially transmitted to the second side. The second display region includes at least one first pixel circuit, and the first light-emitting element is electrically connected with the first pixel circuit; the display substrate is provided with at least one signal transmission line and at least one first dummy wire; at least portion of the signal transmission line is located in the first display region and the second display region, the first light-emitting element is connected with the first pixel circuit through the signal transmission line, at least portion of the first dummy wire is located in the first display region, and is insulated from the signal transmission line and the first light-emitting element; the signal transmission line and the first dummy wire respectively extend along a first direction, an orthographic projection of the first dummy wire on a plane parallel to the display substrate and an orthographic projection of the signal transmission line on the plane parallel to the display substrate are at least partially staggered.

The display substrate provided by the above-described at least one embodiment of the present disclosure optimizes wire design in the first display region, so as to increase light transmittance of the first display region, and increase uniformity and consistency of light passing through the first display region. For example, the first display region is a display region corresponding to an under-screen sensor (e.g., a camera), so that the display substrate provided by the above-described embodiment of the present disclosure reduces or avoids for example, light reflection, that may occur when the under-screen sensor receives light, thereby enabling the under-screen sensor to accurately implement operations such as image capture, distance sensing, light intensity sensing, etc., and further increasing performance of a display device (e.g., a full-screen display device) adopting the display substrate.

Hereinafter, embodiments of the present disclosure will be described in detail with reference to the accompanying drawings. It should be noted that, the same reference signs will be used in different drawings to refer to the same elements that have been described.

FIG. 1 is a schematic plan view of a display substrate provided by at least one embodiment of the present disclosure. As shown in FIG. 1, the display substrate 01 includes a display region 10, and the display region 10 includes a first display region 11 and a second display region 12. For example, the first display region 11 and the second display region 12 do not overlap with each other; and the second display region 12 at least partially surrounds (e.g., completely surrounds) the first display region 11.

For example, the display substrate 01 has a first side for display and a second side opposite to the first side. For example, in some examples, as shown in FIG. 1, the first side is a front side of the display substrate 01 (i.e., the plane shown in FIG. 1), and the second side is a back side of the display substrate. For example, a sensor is provided on the second side of the display substrate 01 at a position corresponding to the first display region 11, and the sensor may be, for example, an image sensor or an infrared sensor, etc. The sensor is configured to receive light from the first side of the display substrate 01, so that operations such as image capture, distance sensing, light intensity sensing, etc., may be performed.

Figure 2A:
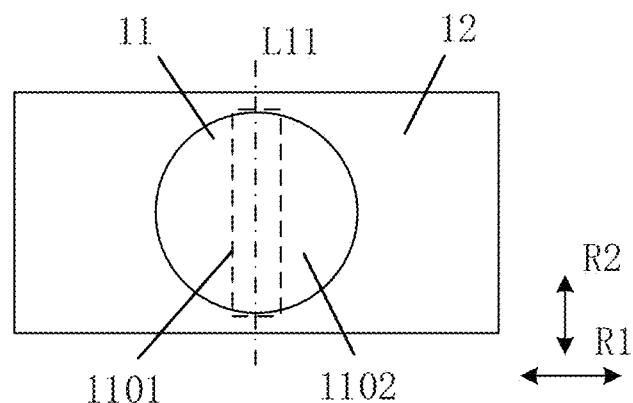
FIG. 2A is a schematic plan view of a first display region and a second display region of the display substrate shown in FIG. 1.
Figure 2B:
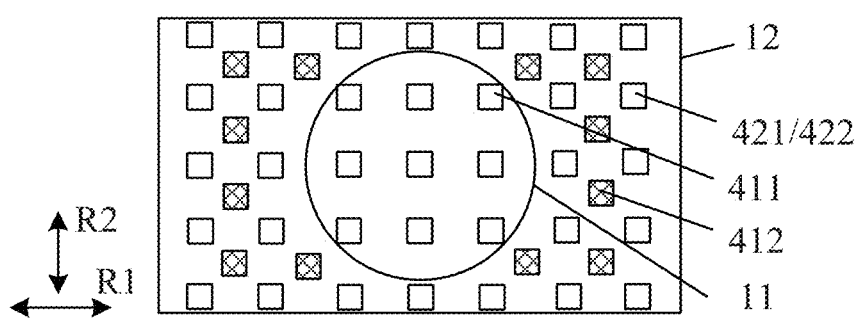
FIG. 2B is a schematic diagram of arrangement of light-emitting elements and pixel circuits in the first display region and the second display region shown in FIG. 2A.

FIG. 2A is a schematic plan view of the first display region and the second display region of the display substrate shown in FIG. 1; and FIG. 2B is a schematic diagram of arrangement of light-emitting elements and pixel circuits in the first display region and the second display region shown in FIG. 2A. It should be noted that, in order to clearly and concisely describe arrangement of the light-emitting elements and the pixel circuits in the first display region and the second display region, rectangle boxes indicated by the reference signs in FIG. 2B are only used to illustrate approximate positions of the light-emitting elements and the pixel circuits, and do not represent specific shapes or specific boundaries of the light-emitting elements and the pixel circuits; the rectangular boxes in FIG. 2B are only used to illustrate arrangement of the light-emitting elements and the pixel circuits, and do not represent the actual number of light-emitting elements and pixel circuits in the first display region and the second display region; and conventional design in the art may be referred to for specific structures of the light-emitting elements and pixel circuits, which will not be limited by the embodiments of the present disclosure.

For example, as shown in FIG. 1, FIG. 2A and FIG. 2B, the second display region 12 at least partially surrounds (e.g., completely surrounds) the first display region 11.

For example, a shape of the first display region 11 is a circle or an ellipse, and a shape of the second display region 12 is a rectangle, but the embodiments of the present disclosure are not limited thereto. For another example, the shapes of the first display region 11 and the second display region 12 are either rectangle or other suitable shape.

Figure 3:
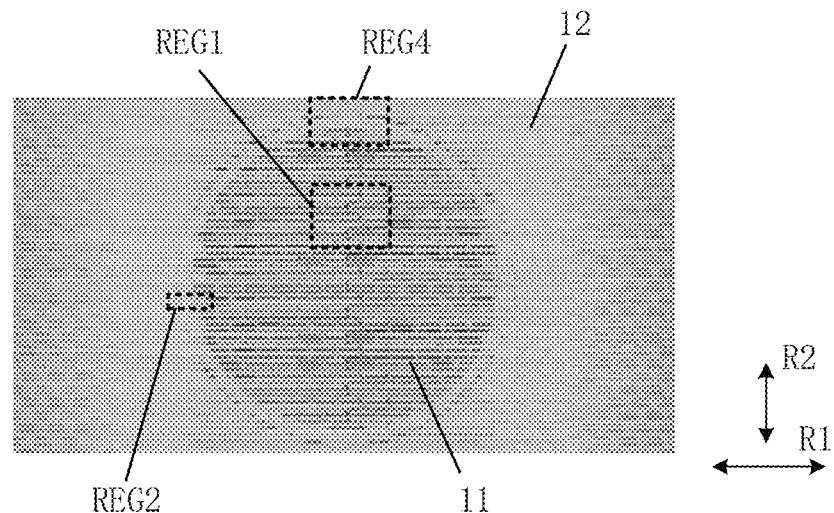
FIG. 3 is a schematic diagram of an example of the first display region and the second display region of the display substrate shown in FIG. 2A.
Figure 4:
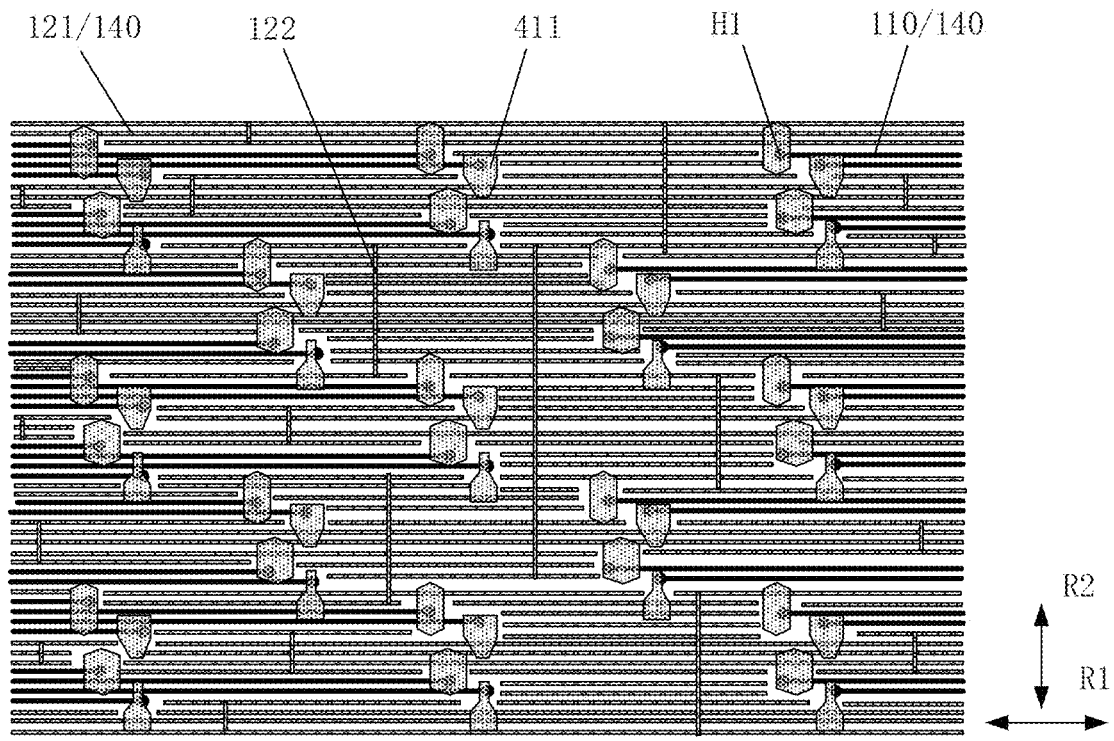
FIG. 4 is an enlarged view of a partial region REG1 of FIG. 3.
Figure 5:
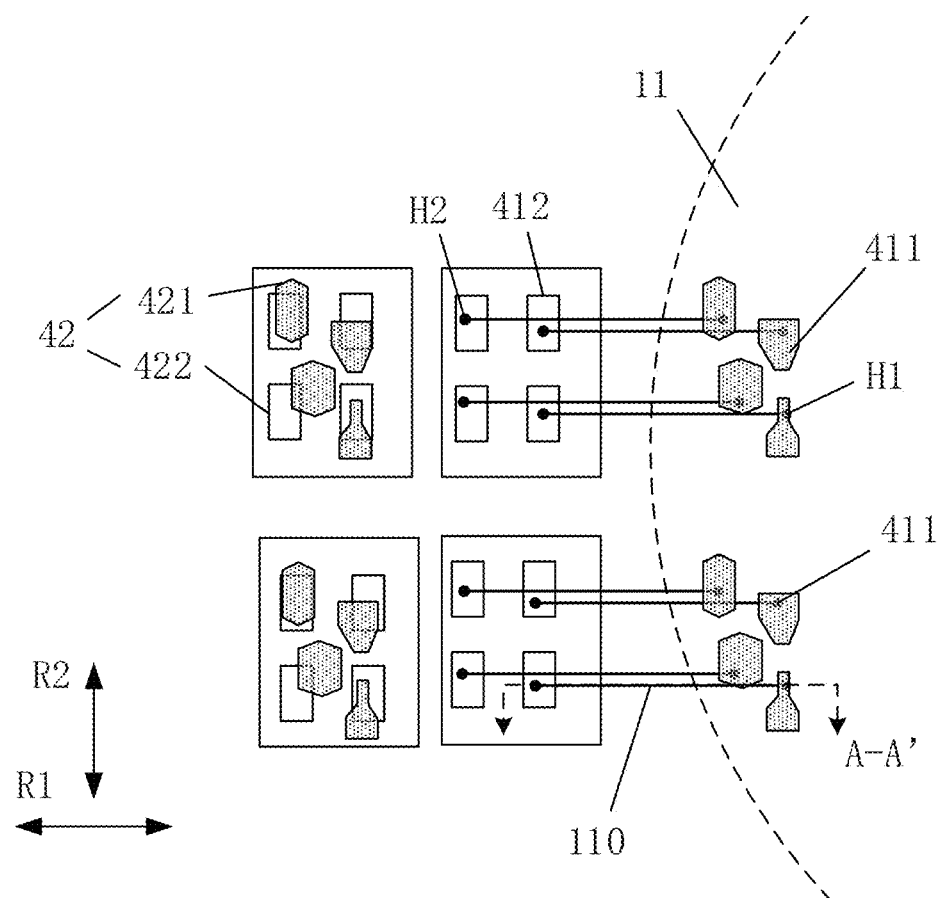
FIG. 5 is an enlarged view of a partial region REG2 of FIG. 3.

FIG. 3 is a schematic diagram of an example of the first display region and the second display region of the display substrate shown in FIG. 2A; FIG. 4 is an enlarged view of a partial region REG1 of FIG. 3; and FIG. 5 is an enlarged view of a partial region REG2 of FIG. 3. It should be noted that, in order to clearly and concisely describe a connection relationship between the first light-emitting element and the first pixel circuit, FIG. 5 only shows structures such as light-emitting elements, pixel circuits, and signal transmission lines, but this does not constitute limitation on the embodiments of the present disclosure.

For example, as shown in FIG. 2A to FIG. 5, the first display region 11 includes at least one (e.g., a plurality of) first light-emitting elements 411. It should be noted that, the related drawings adopts an anode structure of the first light-emitting element 411 to schematically show the first light-emitting element 411 for clarity purpose. For example, the first display region 11 includes a plurality of first light-emitting elements 411 arranged in an array; and the first light-emitting elements 411 are configured to emit light. For example, there is no pixel circuit in the first display region 11; and a pixel circuit (i.e., the first pixel circuit 412) for driving the first light-emitting element 411 is arranged in the second display region 12, so as to reduce an area of the first display region 11 covered by metals, and increase light transmittance of the first display region 11. The pixel circuit for driving the first light-emitting element 411 will be described below, and no details will be repeated here.

For example, the plurality of first light-emitting elements 411 are arranged in a plurality of light-emitting units; and these light-emitting units are arranged in an array. For example, each light-emitting unit includes one or more first light-emitting elements 411. For example, the plurality of first light-emitting elements 411 emit light of same color or light of different colors, for example, emits white light, red light, blue light, green light, etc., which is determined according to actual requirements, and will not be limited by the embodiments of the present disclosure. For example, a conventional arrangement mode of pixel units, for example, GGRB, RGBG, RGB, etc. may be used for arranging the plurality of first light-emitting elements 411, which will not be limited by the embodiments of the present disclosure.

For example, the first display region 11 allows at least portion of light from the first side of the display substrate 01 to be transmitted to the second side of the display substrate 01. In this way, it is convenient to arrange a sensor on the second side of the display substrate 01 and at a position corresponding to the first display region 11; and the sensor receives light from the first side, so that operations such as image capture, distance sensing, light intensity sensing, etc., may be performed.

For example, as shown in FIG. 2A to FIG. 5, the second display region 12 includes at least one (e.g., a plurality of) first pixel circuit 412; and the first light-emitting element 411 is electrically connected with the first pixel circuit 412. For example, the first light-emitting elements 411 are electrically connected with the first pixel circuits 412 in one-to-one correspondence; and the plurality of first pixel circuits 412 are configured to drive the plurality of first light-emitting elements 411 in one-to-one correspondence. That is, one first pixel circuit 412 drives one corresponding first light-emitting element 411, and different first pixel circuits 412 drive different first light-emitting elements 411. For example, the plurality of first pixel circuits 412 may be arranged in a plurality of first pixel driving units; the rectangular boxes shown in FIG. 5 (white filled regions with a black frame indicated by number 412) represent the first pixel driving units; and the first pixel driving units are arranged in an array.

It should be noted that, in FIG. 3, FIG. 4 and FIG. 5, the first pixel driving unit may include one or more first pixel circuits 412. In the case where the light-emitting unit in the first display region 11 includes one first light-emitting element 411, the first pixel driving unit also includes one first pixel circuit 412. In the case where the light-emitting unit in the first display region 11 includes a plurality of first light-emitting elements 411, the first pixel driving unit also includes a plurality of first pixel circuits 412; and the number of first light-emitting elements 411 in each light-emitting unit is, for example, equal to the number of first pixel circuits 412 in each first pixel driving unit, thereby implementing driving in one-to-one correspondence.

For example, the plurality of first light-emitting elements 411 are arranged in an array, and the plurality of first pixel circuits 412 are also arranged in an array. Here, "being arranged in an array" may refer to that a plurality of devices form a group and a plurality of groups of devices are arranged in an array, or may also refer to that the plurality of devices themselves are arranged in an array, which will not be limited by the embodiments of the present disclosure. For example, in some examples, as shown in FIG. 3, FIG. 4 and FIG. 5, every four first light-emitting elements 411 form a group, and a plurality of groups of first light-emitting elements 411 are arranged in an array; accordingly, every four first pixel circuits 412 form a group, and a plurality of groups of first pixel circuits 412 are arranged in an array; and in this situation, each first pixel driving unit includes four first pixel circuits 412.

For example, as shown in FIG. 3, FIG. 4 and FIG. 5, the display substrate 01 is provided with at least one (e.g., a plurality of) signal transmission line 110 and at least one (e.g., a plurality of) first dummy wire 121. At least portion of the signal transmission line 110 is located in the first display region 11 and the second display region 12; and the first light-emitting element 411 is connected with the first pixel circuit 412 through the signal transmission line 110. For example, a first end of the signal transmission line 110 is located in the first display region 11 and is electrically connected with the first light-emitting element 411, and a second end of the signal transmission line 110 is located in the second display region 12 and is electrically connected with the first pixel circuit 412, so as to implement electrical connection between the first light-emitting element 411 and the first pixel circuit 412. A least portion of the first dummy wire 121 is located in the first display region 11, for example, it may be located only in the first display region 11, or may further extend into the second display region 12; and the first dummy wire 121 is insulated from the signal transmission line 110 and the first light-emitting element 411.

For example, the signal transmission line 110 and the first dummy wire 121 respectively extend along the first direction R1; and an orthographic projection of the first dummy wire 121 on a plane parallel to the display substrate 01 and an orthographic projection of the signal transmission line 110 on a plane parallel to the display substrate 01 are at least partially staggered. For example, there is no overlapping portion between the orthographic projection of the first dummy wire 121 on the plane parallel to the display substrate 01 and the orthographic projection of the signal transmission line 110 on the plane parallel to the display substrate 01, so that the first dummy wire 121 and the signal transmission line 110 respectively cover different regions of the first display region 11, so as to increase uniformity and consistency of wire layout in the first display region 11, increase light transmittance of the first display region 11, increase uniformity and consistency of light passing through the first display region 11, and also increase etching uniformity of the display substrate 01 in the first display region 11.

Figure 7:
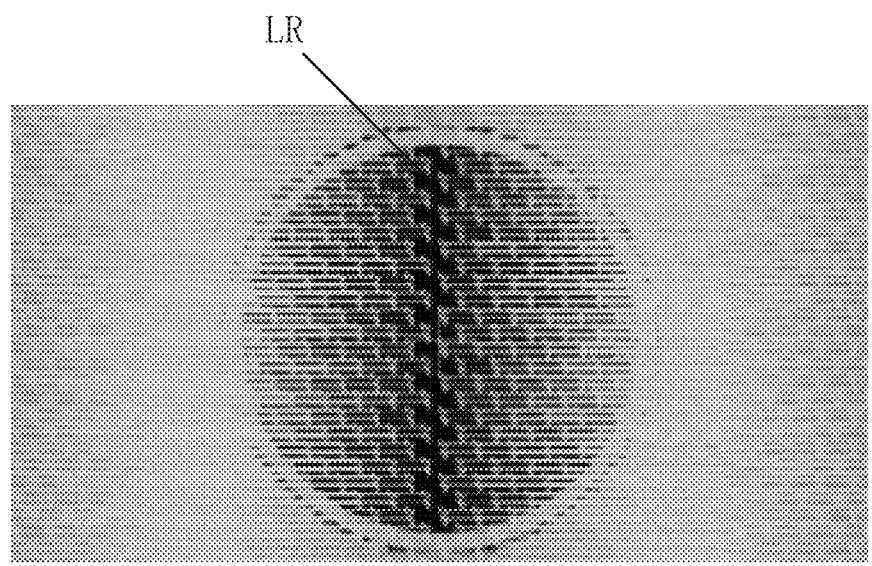
FIG. 7 is a schematic diagram of a light-transmitting region of a display substrate.

For example, taking a light-transmitting region LR of a display substrate shown in FIG. 7 as an example, since distribution of wires in the light-transmitting region LR is relatively non-uniform, uniformity and consistency of light passing through the light-transmitting region LR are low, which in turn seriously adversely affect the light transmission effect of the light-transmitting region LR. For example, the under-screen sensor provided corresponding to the light-transmitting region LR is prone to have problems such as light reflection when receiving light, so that it is difficult to accurately implement operations such as image capture, distance sensing, and light intensity sensing, etc.

As compared with the light-transmitting region LR of the display substrate shown in FIG. 7, the display substrate 01 provided by the above-described embodiments of the present disclosure is provided with the first dummy wire 121 that does not overlap with the signal transmission line 110 on the plane parallel to the display substrate 01, so that wire design in the first display region 11 is optimized, for example, uniformity and consistency of wire layout in the first display region 11 are increased, so as to increase uniformity and consistency of light passing through the first display region 11, and further increase light transmittance of the first display region 11. For example, in the case where the under-screen sensor (e.g., camera) is correspondingly provided in the first display region 11, the display substrate 01 provided by the above-described embodiments of the present disclosure can reduce or avoid problems such as light reflection that may occur when the under-screen sensor receives light, thereby enabling the under-screen sensor to accurately implement operations such as image capture, distance sensing, light intensity sensing, etc., and further increasing performance of a display device (for example, a full-screen display device) adopting the display substrate 01.

In some embodiments of the present disclosure, the first display region 11 has a region that is covered by the orthographic projection of the signal transmission line 110 on the plane parallel to the display substrate 01 and covered by the orthographic projection of the first dummy wire 121 on the plane parallel to the display substrate 01, a ratio of an area of the region to an area of the first display region is 70% to 95%, further, for example, 80% to 90%; or for example, 75% or 85%. That is, the signal transmission line 110 and the first dummy wire 121 as a whole may cover 70% to 95% of the total area of the first display region 11 on the plane parallel to the display substrate 01, so that uniformity and consistency of wire layout in the first display region 11 are further enhanced, so as to increase uniformity and consistency of light passing through the first display region 11 and increase a light transmission effect of the first display region 11.

In some embodiments of the present disclosure, as shown in FIG. 3, FIG. 4 and FIG. 5, the first dummy wire 121 and the signal transmission line 110 are located in a same layer, so as to simplify a preparation process of the display substrate 01 and reduce preparation costs of the display substrate 01.

In some other embodiments of the present disclosure, according to actual requirements, for example, based on different requirements of improving a signal transmission load on the signal transmission line or further simplifying a fabrication process, etc., the first dummy wire and the signal transmission line may also be located in different layers; or, a portion of the first dummy wire may be arranged in a same layer as the signal transmission line, and the other portion of the first dummy wire is arranged in a layer different from the signal transmission line, which will not be limited by the embodiment of the present disclosure.

It should be noted that, in the description of the present disclosure, being located in a "same layer" refers to being located in a same film layer. For example, wires located in a same film layer are prepared by using a same process, for example, the wires are formed by using one patterning process. For example, in the case that the display substrate 01 includes a base substrate, in a direction perpendicular to the base substrate, distances from wires located in a same film layer to the base substrate are the same or substantially the same. That is, the distances from the wires in the film layer to the base substrate are the same or substantially the same. In the following description, the above description may be referred to for the meaning of being located in a "same layer", and no details will be repeated here.

It should be noted that, in the description of the present disclosure, being located in "different layers" refers to being located in different film layers, wherein, these different film layers are insulated from each other at positions where there are no via holes provided. For example, in the case where it is necessary to electrically connect wires located in different film layers with each other, the wires located in different film layers are electrically connected with each other by using via holes. For example, these different film layers are prepared in different processes, for instance, firstly, one of these different film layers is prepared by using a first process, and then another of these different film layers is prepared by using a second process. For example, after the first process and before the second process, an insulating layer may also be prepared by using a third process; the insulating layer is located between different film layers, so that the different film layers are insulated from each other at the positions where there are no via holes provided. For example, the first process, the second process and the third process may be the same or different. For example, in the case where the display substrate 01 includes a base substrate, in a direction perpendicular to the base substrate, distances from the different film layers to the base substrate are different from each other. That is, among different film layers, one film layer is closer to the base substrate, and the other film layer is farther from the base substrate. In the following description, the above description may be referred to for the meaning of being located in "different layers", and no details will be repeated here.

In some embodiments of the present disclosure, as shown in FIG. 3, FIG. 4 and FIG. 5, the first dummy wire 121 and the signal transmission line 110 both extend along a straight line and are parallel to each other, which further facilitates uniformity and consistency of layout of the first dummy wire 121 and the signal transmission line 110 in the first display region 11, further simplifies process requirements of the display substrate 01 and in turn facilitates preparation of the display substrate 01.

It should be noted that, in some other embodiments of the present disclosure, according to actual requirements, for example, based on layout design of the light-emitting elements or other structures or devices in the first display region 11, the first dummy wire 121 or the signal transmission line 110 may also extend along a curved line, a folded line or other suitable shape, alternatively, an extension line of the first dummy wire 121 and an extension line of the signal transmission line 110 may intersect with each other, which will not be limited by the embodiment of the present disclosure.

In some embodiments of the present disclosure, the first dummy wire 121 is configured to receive a first voltage signal (e.g., a high-level signal or a low-level signal, the low-level signal being, for example, a ground signal), or is also configured to be in a floating state, which will not be limited by the embodiment of the present disclosure. For example, taking that the first dummy wire 121 receives the high-level signal or the low-level signal as an example, the first dummy wire 121 reduces or avoids signal crosstalk between the signal transmission lines 110, so as to increase uniformity and stability of a circuit environment, and increase a signal transmission effect of the signal transmission line 110.

For example, as shown in FIG. 3, FIG. 4 and FIG. 5, the plurality of first dummy wires 121 in the first display region 11 are arranged along a second direction R2 different from the first direction R1 and are configured to receive the first voltage signal. The display substrate further includes at least one (e.g., a plurality of) second dummy wire 122; the second dummy wires 122 extend along the second direction R2 and are electrically connected with the plurality of first dummy wires 121, so that the plurality of first dummy wires 121 are electrically connected with each other to receive the first voltage signal. As such, an electrical connection effect between the plurality of first dummy wires 121 can be increased, and uniformity and stability of the circuit environment can be further increased.

It should be noted that, an included angle between the first direction R1 and the second direction R2 may be, for example, from 70° to 90°, which includes 70° and 90°. For example, the included angle between the first direction R1 and the second direction R2 is 70°, 75°, 85°, 90°, or 80°, etc.; and a specific value of the included angle may be set according to actual situations, which will not be limited by the embodiment of the present disclosure.

For example, at least one of the plurality of first dummy wires 121 is electrically connected with a first power line through a via hole structure, and the first power line supplies the first voltage signal. For example, the first power line is a power line configured to supply the first voltage signal for display to the first pixel circuit 412, so that wire layout of the display substrate 01 can be simplified, and structural design of the display substrate 01 can be optimized.

Figure 6:
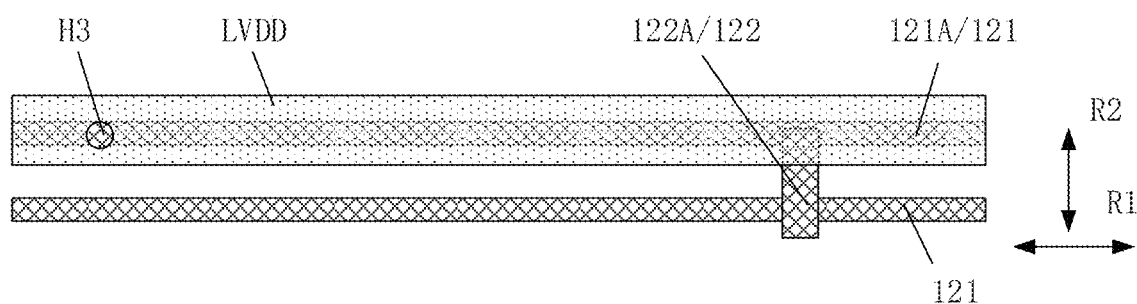
FIG. 6 is a schematic diagram of an example of a portion of a display substrate that is close to an edge of a display region provided by at least one embodiment of the present disclosure.

FIG. 6 is a schematic diagram of an example of a portion of a display substrate that is close to an edge of a display region provided by at least one embodiment of the present disclosure; for example, a portion shown in FIG. 6 may be located in a partial region REG4 shown in FIG. 3. For example, a first dummy wire 121A of the plurality of first dummy wires 121 that is close to an edge of the display substrate 01 in the second direction R2 is electrically connected with the first power line LVDD through a via hole structure H3 to receive the first voltage signal, and transmits the received first voltage signal to other first dummy wires 121 and/or second dummy wires 122 through the second dummy wire 122A connected with the first dummy wire 121A.

It should be noted that, a shape and a position of the first power line LVDD as well as an overlapping area thereof with the first dummy wire 121A in FIG. 6 are only schematically illustrated; a specific shape, an arrangement position, etc. of the first power line LVDD will not be limited by the embodiments of the present disclosure. In some embodiments of the present disclosure, the first power line LVDD may be electrically connected with only one first dummy wire 121A as shown in FIG. 6; while in some other embodiments of the present disclosure, the first power line LVDD may also be electrically connected with a plurality of, for example two, three, or four first dummy wires 121A, which will not be limited by the embodiments of the present disclosure. In some embodiments of the present disclosure, the via hole structure H3 for implementing electrical connection between the first power line LVDD and the first dummy wire 121A includes only one via hole as shown in FIG. 6; in some other embodiments of the present disclosure, the via hole structure H3 for implementing electrical connection between the first power line LVDD and the first dummy wire 121A includes a plurality of, for example two, three, or four via holes, which will not be limited by the embodiments of the present disclosure.

In some embodiments of the present disclosure, the second dummy wire 122 is located in a same layer as the first dummy wire 121 as shown in FIG. 4, so as to simplify a fabrication process and reduce fabrication costs; or, in some other embodiments of the present disclosure, the second dummy wire 122 is located in a layer different from the first dummy wire 121, for example, the second dummy wire 122 and the first dummy wire 121 are located in different film layers, these different film layers are insulated from each other at positions where there are no via holes provided, to reduce or avoid signal crosstalk between wires, which will not be limited by the embodiments of the present disclosure.

For example, as shown in FIG. 3, FIG. 4 and FIG. 5, the plurality of first dummy wires 121 are arranged along the second direction R2; the plurality of signal transmission lines 110 are arranged along the second direction R2; the plurality of signal transmission lines 110 and the plurality of first dummy wires 121 constitute a wiring array; one signal transmission line 110 serves as a line unit 140 in the wiring array; one first dummy wire 121 serves as a line unit 140 in the wiring array; and distances from at least one line unit 140 in the wiring array to two adjacent line units 140 respectively in the second direction R2 are equal. That is, distances from at least one first dummy wire 121 of the plurality of first dummy wires 121 or at least one signal transmission line 110 of the plurality of signal transmission lines 110 to two adjacent (e.g., located on both sides thereof in the second direction R2) wires (the two wires may be another first dummy wire 121 and/or another signal transmission line 110) are equal. As such, wire design in the first display region 11 is further optimized, and uniformity and consistency of wire layout in the first display region 11 are further increased, which furthers increase uniformity and consistency of light passing through the first display region 11, and increases light transmittance of the first display region 11.

For example, as shown in FIG. 3, FIG. 4 and FIG. 5, in the first display region 11, distances from each signal transmission line 110 to two adjacent wires (the two wires may be the first dummy wire 121 and/or another signal transmission line 110) in the second direction R2 are equal, so that not only uniformity and consistency of wire layout in the first display region 11 are increased, but also uniformity and stability of the circuit environment is increased, so as to increase a signal transmission effect of the signal transmission line 110.

For example, as shown in FIG. 2A to FIG. 5, the first display region 11 includes a middle region 1101 and a peripheral region 1102 located on both sides of the middle region 1101 in the first direction R1 (e.g., completely surrounding the middle region 1101 in the first direction R1); a central axis L11 of the first display region 11 is located in the middle region 1101; the peripheral region 1102 is adjacent to the second display region 12; and a per unit area distribution ratio of the plurality of first dummy wires 121 in the middle region 1101 is greater than a per unit area distribution ratio of the first dummy wires 121 in the peripheral region 1102. For example, along a direction from the peripheral region 1102 to the middle region 1101 in the first display region 11 (for example, a direction from an edge of the first display region 11 in the first direction R1 to the central axis L11), the per unit area distribution ratio of the plurality of first dummy wires 121 gradually increases. The unit area distribution ratio of the plurality of signal transmission lines 110 in the middle region 1101 is less than the per unit area distribution ratio of the plurality of signal transmission lines 110 in the peripheral region 1102, for example, along the direction from the peripheral region 1102 to the middle region 1101 in the first display region 11, the per unit area distribution ratio of the plurality of signal transmission lines 110 gradually decreases, so in the display substrate 01 provided by the embodiment of the present disclosure, a distribution mode of the first dummy wires 121 in the first display region 11 is matched with a distribution mode of the signal transmission lines 110 in the first display region 11, so as to further optimize wire design in the first display region 11, and further increase uniformity and consistency of wire layout in the first display region 11, thereby further increasing uniformity and consistency of light passing through the first display region 11, and increasing light transmittance of the first display region 11.

It should be noted that, the above-described "per unit area distribution ratio" refers to a distribution area of wires per unit area, that is, the greater the per unit area distribution ratio, the greater the area covered by the wires per unit area; for example, in a case where lengths of the wires are basically the same, the denser the wire distribution in the corresponding region, the greater the number thereof; the less the per unit area distribution ratio, the smaller the area covered by the wires in the per unit area; for example, in the case where the lengths of the wires are basically the same, the sparser the distribution of the wires in the corresponding region, the less the number thereof.

In some embodiments of the present disclosure, the signal transmission line 110, the first dummy wire 121 and the second dummy wire 122 each includes a transparent electrically conductive wire, so as to further increase light transmittance of the first display region 11 of the display substrate 01. The transparent electrically conductive wire may be made from, for example, Indium Tin Oxide (ITO) or other suitable transparent electrically conductive material.

In some embodiments of the present disclosure, a width of the first dummy wire 121 in the second direction R2 is equal to a width of the signal transmission line 110 in the second direction R2, so that uniformity and consistency of distribution of the first dummy wires 121 and the signal transmission lines 110 in the first display region 11 are further increased, and uniformity and stability of the circuit environment are further increased, so as to increase a signal transmission effect of the signal transmission line 110.

In some embodiments of the present disclosure, as shown in FIG. 3, FIG. 4 and FIG. 5, the signal transmission line 110 is electrically connected with an anode of the first light-emitting element 411 through a via hole structure H1, and the via hole structure H1 at least penetrates through an insulating layer located between the signal transmission line 110 and the anode of the first light-emitting element 411, so as to supply an electrical signal to the first light-emitting element 411 and drive the first light-emitting element 411 to emit light.

For example, an orthographic projection of the via hole structure H1 on the plane parallel to the display substrate 01 and an orthographic projection of the first dummy wires 121 on the plane parallel to the display substrate 01 do not overlap with each other; for example, in a direction perpendicular to the display substrate 01, the first dummy wires 121 are arranged to avoid a position of the via hole structure H1 as much as possible. As such, possible interference of the first dummy wire 121 on the electrical signal supplied to the first light-emitting element 411 is reduced or avoided, so as to enhance stability of operation of the first light-emitting element 411 and increase light emission effect of the first light-emitting element 411.

It should be noted that, according to an actual structure of the display substrate 01, the via hole structure H1 may also penetrate through other film layers or structures located between the signal transmission line 110 and the anode of the first light-emitting element 411 besides the insulating layer, so as to implement electrical connection between the signal transmission line 110 and the anode of the first light-emitting element 411, which will not be limited by the embodiment of the present disclosure.

For example, the first pixel circuit 412 includes a thin film transistor; the thin film transistor includes a gate electrode, a first electrode and a second electrode; and the signal transmission line 110 is electrically connected with the first electrode or the second electrode of the thin film transistor, so as to supply an output signal of the first pixel circuit 412 to the first light-emitting element 411. For example, according to the circuit structure of the first pixel circuit 412, the thin film transistor may be a driving thin film transistor in the first pixel circuit 412, a light emission control thin film transistor in the first pixel circuit 412, or other types of thin film transistors.

Figure 8:
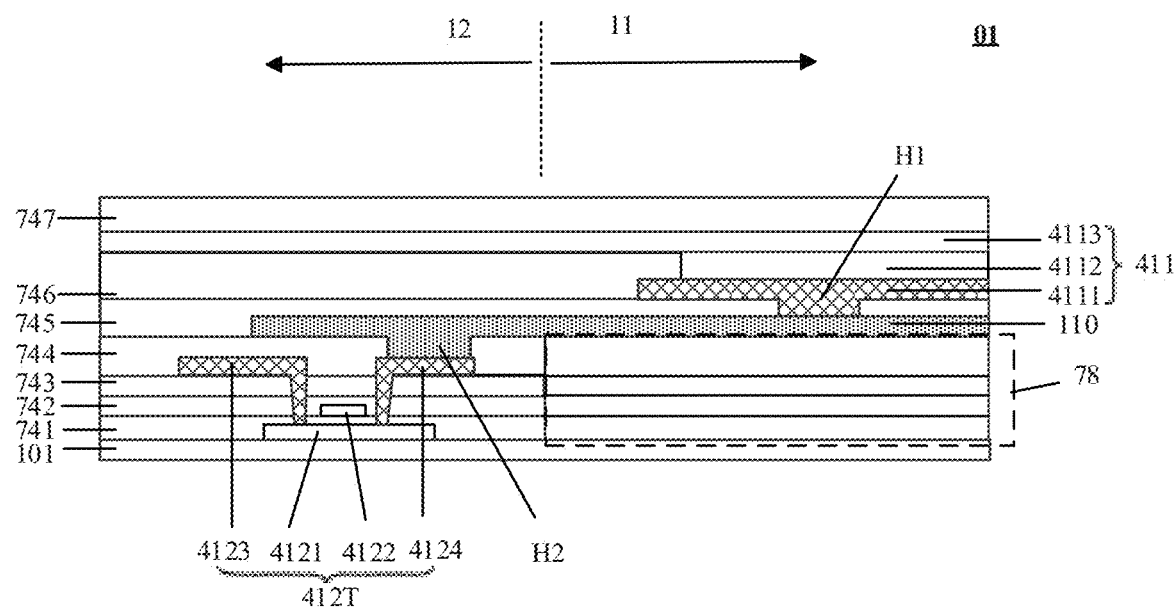
FIG. 8 is a schematic diagram of a laminate structure of a display substrate provided by at least one embodiment of the present disclosure.

FIG. 8 is a schematic diagram of a laminate structure of a display substrate provided by at least one embodiment of the present disclosure; and the schematic diagram of the laminate structure mainly schematically shows a portion of structure of the first pixel circuit 412 and the first light-emitting element 411. For example, FIG. 8 is a schematic diagram of a cross-sectional structure of the display substrate 01 shown in FIG. 5 taken along line A-A'.

For example, as shown in FIG. 5 and FIG. 8, the display substrate 01 includes a source-drain metal layer (an SD layer) located on the base substrate 101; and the first electrode and the second electrode of the thin film transistor 412T of the first pixel circuit 412 (i.e., source-drain electrodes, for example, a source electrode 4123 and a drain electrode 4124) are located in the source-drain metal layer.

The first light-emitting element 411 includes an anode 4111, a cathode 4113, and a first light-emitting layer 4112 located between the anode 4111 and the cathode 4113; the anode 4111 of the first light-emitting element 411 is located above the source-drain metal layer; and the film layer where the signal transmission line 110 and the first dummy wire 121 (not shown in FIG. 8) are located is located between the anode 4111 of the first light-emitting element 411 and the source-drain metal layer. The anode 4111 is electrically connected with the signal transmission line 110 through the via hole structure H1, and is further electrically connected with the thin film transistor 412T included in the first pixel circuit 412 through the signal transmission line 110.

For example, the anode 4111 includes a plurality of anode sub-layers, for example, include an ITO/Ag/ITO three-layer structure (not shown), and a specific form of the anode 4111 will not be limited by the embodiment of the present disclosure. For example, the cathode 4113 is a structure formed on an entire surface of the display substrate 01; and a metal material of the cathode 4113 may include, for example, lithium (Li), aluminum (Al), magnesium (Mg), silver (Ag) and the like. For example, since the cathode 4113 may be formed as a relatively thin layer, the cathode 4113 has good light transmittance.

For example, the thin film transistor 412T includes structures such as an active layer 4121, a gate electrode 4122, source-drain electrodes (i.e., a source electrode 4123 and a drain electrode 4124) and the like. For example, the active layer 4121 is provided on the base substrate 101; a first gate insulating layer 741 is provided on a side of the active layer 4121 that is away from the base substrate 101. The gate electrode 4122 is located on a side of the first gate insulating layer 741 that is away from the base substrate 101; and a second gate insulating layer 742 is provided on a side of the gate electrode 4122 that is away from the base substrate 101. The source-drain electrode are provided on a side of an intermediate insulating layer 743 that is away from the base substrate 101, and are electrically connected with the active layer 4121 through via holes located in the first gate insulating layer 741, the second gate insulating layer 742 and the intermediate insulating layer 743. A planarization layer 744 is provided on a side of the source-drain electrodes that is away from the base substrate 101 to planarize the first pixel circuit 412.

For example, the planarization layer 744 has a via hole H2 therein; and the drain electrode 4124 (or the source electrode 4123) of the thin film transistor 412T is electrically connected with the signal transmission line 110 through the via hole H2 in the planarization layer 744, and is further electrically connected with the anode 4111 through the signal transmission line 110.

For example, the first display region 11 further includes a transparent support layer 78 located on the base substrate 101, and the first light-emitting element 411 is located on a side of the transparent support layer 78 that is away from the base substrate 101. As such, with respect to the base substrate 101, the first light-emitting element 411 in the first display region 11 is substantially located at a same height as the second light-emitting element in the second display region 12 (referring to subsequent description of the second display region 12 and the second light-emitting element 411) and the third light-emitting element in the third display region (referring to subsequent description of the third display region 13 and the third light-emitting element 413), so that the display effect of the display substrate 01 is increased.

For example, the display substrate 01 further includes other structures such as a pixel defining layer 746, an encapsulation layer 747, etc. For example, the pixel defining layer 746 is provided on the anode 4111 (e.g., on a portion of structure of the anode 4111), includes a plurality of openings to define different pixels or sub-pixels; and the first light-emitting layer 4112 is formed in the openings of the pixel defining layer 746. For example, the encapsulation layer 747 includes a single-layer or multi-layer encapsulation structure; the multi-layer encapsulation structure, for example, includes a laminate of an inorganic encapsulation layer and an organic encapsulation layer, so as to increase the encapsulation effect of the display substrate 01.

For example, in the respective embodiments of the present disclosure, the base substrate 101 is a glass substrate, a quartz substrate, a metal substrate, or a resin-based substrate, etc., and it may be a rigid substrate or a flexible substrate, which will not be limited by the embodiments of the present disclosure.

For example, the first gate insulating layer 741, the second gate insulating layer 742, the intermediate insulating layer 743, the planarization layer 744, the insulating layer 745, the pixel defining layer 746, and the encapsulation layer 747 may include an inorganic insulating material, such as silicon oxide, silicon nitride, silicon oxynitride, or may include an organic insulating material, such as polyimide, polyphthalimide, polyphthalamide, acrylic resin, benzocyclobutene, or phenolic resin; and materials of the above-described respective functional layers will not be limited by the embodiment of the present disclosure.

For example, a material of the active layer 4121 includes a semiconductor material such as polysilicon or an oxide semiconductor (e.g., indium gallium zinc oxide). For example, a portion of the active layer 4121 is conductorized by conductorization process such as doping, so as to have high conductivity.

For example, a material of the gate electrode 4122 includes a metal material or an alloy material, the metal material is such as molybdenum, aluminum, titanium and the like.

For example, a material of the source electrode 4123 and the drain electrode 4124 includes a metal material or an alloy material, for example, a metal single-layer or multi-layer structure formed of molybdenum, aluminum, titanium, etc., for example, the multi-layer structure is a multi-metallic layer laminate, for example, a titanium-aluminum-titanium (Ti/Al/Ti) three-layer metal laminate, etc.

In some embodiments of the present disclosure, as shown in FIG. 1, the display region 10 further includes a third display region 13; the third display region 13 at least partially surrounds (e.g., partially surrounds) the second display region 12; and the first display region 11, the second display region 12 and the third display region 13 do not overlap with each other. It should be noted that, in some examples, the display substrate 01 further includes a peripheral region; and the peripheral region at least partially surrounds the third display region 13.

For example, as shown in FIG. 2B and FIG. 5, the second display region 12 further includes at least one (e.g., a plurality of) second light-emitting element 421 and at least one (e.g., a plurality of) second pixel circuit 422; the second light-emitting element 421 is electrically connected with the second pixel circuit 422, for example, in one-to-one correspondence; and the second pixel circuits 422 are configured to drive the second light-emitting elements 421 to emit light. It should be noted that, a rectangular box indicated by the reference sign 422 in FIG. 5 is only used to show an approximate position of the second pixel circuit 422, and does not indicate a specific shape of the second pixel circuit 422 or a specific boundary of the second pixel circuit 422. For example, the plurality of second light-emitting elements 421 are arranged in an array; and the plurality of second pixel circuits 422 are also arranged in an array. For example, at least one second light-emitting element 421 and a second pixel circuit 422 corresponding thereto constitute a second pixel driving unit 42.

It should be noted that, in FIG. 5, the second pixel driving unit 42 may include one second pixel circuit 422 and one second light-emitting element 421, or may include a plurality of second pixel circuits 422 and a plurality of second light-emitting elements 421. In the case where the second pixel driving unit 42 includes a plurality of second pixel circuits 422 and a plurality of second light-emitting elements 421, the number of second pixel circuits 422 in each second pixel driving unit 42 is, for example, equal to the number of second light-emitting elements 421, so as to implement driving in one-to-one correspondence.

For example, the plurality of second light-emitting elements 421 are arranged in an array; and the plurality of second pixel circuits 422 are also arranged in an array. Here, "being arranged in an array" may refer to that a plurality of devices form a group and a plurality of groups of devices are arranged in an array, or may also refer to that the plurality of devices themselves are arranged in an array, which will not be limited by the embodiments of the present disclosure. For example, in some examples, as shown in FIG. 5, every four second light-emitting elements 421 form a group, and a plurality of groups of second light-emitting elements 421 are arranged in an array; accordingly, every four second pixel circuits 422 form a group, and a plurality of groups of second pixel circuits 422 are arranged in an array; and in this situation, each second pixel driving unit 42 includes four second pixel circuits 422 and four second light-emitting elements 421.

Figure 9:
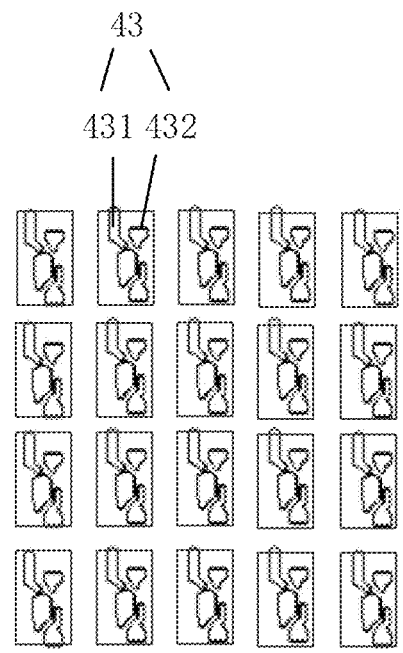
FIG. 9 is an enlarged view of a partial region REG3 of a third display region of the display substrate shown in FIG. 1.

FIG. 9 is an enlarged view of a partial region REG3 of the third display region 13 of the display substrate shown in FIG. 1.

For example, as shown in FIG. 9, the third display region 13 includes at least one (e.g., a plurality of) third light-emitting element 431 and at least one (e.g., a plurality of) third pixel circuit 432; the third light-emitting elements 431 are electrically connected with the third pixel circuits 432, for example, in one-to-one correspondence; and the third pixel circuit 432 is configured to drive the third light-emitting element 431 to emit light. It should be noted that, a rectangular box indicated by the reference sign 432 in FIG. 9 is only used to show an approximate position of the third pixel circuit 432, and does not indicate a specific shape of the third pixel circuit 432 or a specific boundary of the third pixel circuit 432. For example, a plurality of third light-emitting elements 431 are arranged in an array; and a plurality of third pixel circuits 432 are also arranged in an array. For example, at least one third light-emitting element 431 and a third pixel circuit 432 corresponding thereto constitute a third pixel driving unit 43.

It should be noted that, in FIG. 9, the third pixel driving unit 43 may include one third pixel circuit 432 and one third light-emitting element 431, or may include a plurality of third pixel circuits 432 and a plurality of third light-emitting elements 431. In the case where the third pixel driving unit 43 includes a plurality of third pixel circuits 432 and a plurality of third light-emitting elements 431, the number of third pixel circuits 432 in each third pixel driving unit 43 is, for example, equal to the number of third light-emitting elements 431, so as to implement driving in one-to-one correspondence.

For example, the plurality of third light-emitting elements 431 are arranged in an array; and the plurality of third pixel circuits 432 are also arranged in an array. Here, "being arranged in an array" may refer to that a plurality of devices form a group and a plurality of groups of devices are arranged in an array, or may also refer to that the plurality of devices themselves are arranged in an array, which will not be limited by the embodiments of the present disclosure. For example, in some examples, as shown in FIG. 9, every 4 third light-emitting elements 431 form a group, and a plurality of groups of third light-emitting elements 431 are arranged in an array; accordingly, every 4 third pixel circuits 432 form a group, and a plurality of groups of third pixel circuits 432 are arranged in an array; and in this situation, each third pixel driving unit 43 includes 4 third pixel circuits 432 and 4 third light-emitting elements 431.

For example, a per unit area distribution ratio of the plurality of first light-emitting elements 411 in the first display region 11 is less than a per unit area distribution ratio of the plurality of second light-emitting elements 421 in the second display region 12; a per unit area distribution ratio of the plurality of second light-emitting elements 421 is less than a per unit area distribution ratio of the plurality of third light-emitting elements 431 in the third display region 13. For example, the first display region 11 and the second display region 12 is referred to as a low-resolution region of the display substrate 01; and correspondingly, the third display region 13 is referred to as a high-resolution region of the display substrate 01. For example, a sum of pixel light-emitting areas of the second display region 12 and the first display region 11 is ⅛ to ½ of a pixel light-emitting area of the third display region 13.

It should be noted that, in some examples, the per unit area distribution ratio of the plurality of first light-emitting elements 411 in the first display region 11 may also be equal to the per unit area distribution ratio of the plurality of second light-emitting elements 421 in the second display region 12, which is determined according to actual requirements, and will not be limited by the embodiments of the present disclosure.

The per unit area distribution ratio of the light-emitting elements in the first display region 11, the second display region 12 and the third display region 13 is gradually increased, which facilitates light of the first side of the display substrate 01 to pass through the first display region 11 in order to reach the second side, at the same time of ensuring that the three display regions emit light normally to display an image, and further facilitates the sensor provided on the second side of the display substrate 01 to sense the light.

For example, the first light-emitting element 411, the second light-emitting element 421 and the third light-emitting element 431 each includes an Organic Light-Emitting Diode (OLED). Of course, the embodiments of the present disclosure are not limited thereto, and the first light-emitting element 411, the second light-emitting element 421 and the third light-emitting element 431 may also be Quantum Dot Light-Emitting Diodes (QLEDs) or other suitable light-emitting devices, which will not be limited by the embodiments of the present disclosure.

For example, the display substrate 01 provided by the embodiment of the present disclosure is an Organic Light- Emitting Diode (OLED) display substrate or a Quantum Dot Light-Emitting Diode (QLED) display substrate, etc. and the specific type of the display substrate will not be limited by the embodiment of the present disclosure.

For example, in the case where the display substrate is an OLED display substrate, the light-emitting layer (e.g., the foregoing first light-emitting layer 4112) includes a small molecular organic material or a polymer molecular organic material, or the light-emitting layer is a fluorescent light-emitting material or a phosphorescent light-emitting material to emit red light, green light, blue light, or white light. Moreover, according to different actual requirements, in different examples, the light-emitting layer may further include functional layers such as an electron injection layer, an electron transport layer, a hole injection layer, or a hole transport layer.

For example, in the case where the display substrate is a QLED display substrate, the light-emitting layer (e.g., the foregoing first light-emitting layer 4112) includes a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and indium arsenide quantum dots, etc., and a particle size of the quantum dot is 2 nm to 20 nm.

At least one embodiment of the present disclosure further provides a display device, and the display device includes the display substrate provided by any one of the embodiments of the present disclosure.

Figure 10:
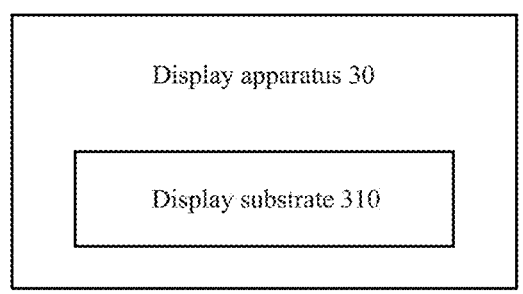
FIG. 10 is a schematic block diagram of a display device provided by at least one embodiment of the present disclosure.

FIG. 10 is a schematic block diagram of a display device provided by at least one embodiment of the present disclosure. For example, as shown in FIG. 10, the display device 30 includes a display substrate 310, the display substrate 310 may be the display substrate provided by any one of the embodiments of the present disclosure, for example, the foregoing display substrate 01.

The display device 30 may be a smart phone, a tablet personal computer, a laptop, a television, and any other electronic apparatus having a display function. For example, in the case where the display device 30 is a smart phone or a tablet personal computer, the smart phone or the tablet personal computer may have full-screen design, that is, there is no peripheral region surrounding, for example, the first display region 11, the second display region 12 or the third display region 13. In addition, the smart phone or the tablet personal computer further has an under-screen sensor (e.g., a camera, an infrared sensor, etc.), which performs operations such as image capture, distance sensing, and light intensity sensing, etc.

It should be noted that, other suitable components may be used in the display substrate 310 and the display device 30 (e.g., an image data encoding/decoding apparatus, a clock circuit, etc.), which should be understood by those ordinarily skilled in the art, and should not be taken as limitations on the embodiments of the present disclosure, and no details will be repeated here.

Figure 11:
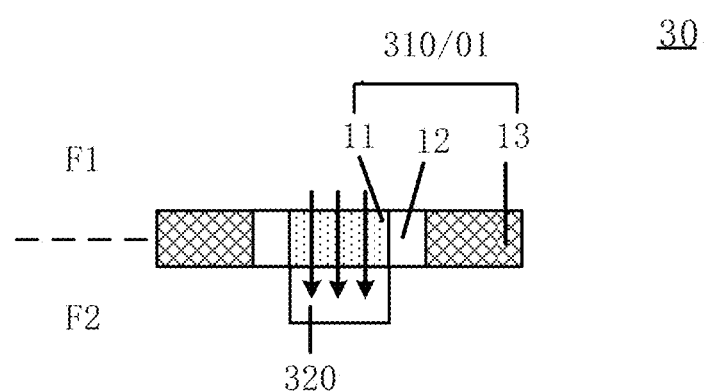
FIG. 11 is a schematic diagram of a laminate structure of a display device provided by at least one embodiment of the present disclosure.

FIG. 11 is a schematic diagram of a laminate structure of a display device provided by at least one embodiment of the present disclosure. For example, as shown in FIG. 11, the display device 30 includes a display substrate 310; and the display substrate 310 may be the display substrate provided by any one of the embodiments of the present disclosure, for example, the foregoing display substrate 01. For example, the display device 30 further includes a sensor 320.

For example, the foregoing display substrate 01 is taken as an example of the display substrate 310, the display substrate 01 includes a first side F1 for display and a second side F2 opposite to the first side F1. That is, the first side F1 is a display side, and the second side F2 is a non-display side. The display substrate 01 is configured to perform a display operation on the first side F1, that is, the first side F1 of the display substrate 01 is a light emergent side of the display substrate 01; and the first side F1 faces towards a user. The first side F1 and the second side F2 are opposite to each other in a normal direction of a display surface of the display substrate 01.

As shown in FIG. 11, the sensor 320 is provided on the second side F2 of the display substrate 01; and the sensor 320 is configured to receive light from the first side F1. For example, the sensor 320 is stacked with the first display region 11 in the normal direction (e.g., a direction perpendicular to the display substrate 01) of the display surface of the display substrate 01. The sensor 320 receives and processes an optical signal passing through the first display region 11. The optical signal may be visible light, infrared light, etc. For example, the first display region 11 allows at least portion of light from the first side F1 to be transmitted to the second side F2. For example, the first display region 11 is not provided with a pixel circuit, in this situation, light transmittance of the first display region 11 is increased.

For example, an orthographic projection of the sensor 320 on the display substrate 01 at least partially overlaps with the first display region 11. For example, in some examples, in the case where the direct-lit arrangement is adopted, the orthographic projection of the sensor 320 on the display substrate 01 is located within the first display region 11. For example, in other examples, in the case that other light guide element (e.g., a light guide plate, a light guide tube, etc.) is adopted to cause light to be incident onto the sensor 320 from a side face, the orthographic projection of the sensor 320 on the display substrate 01 partially overlaps with the first display region 11. In this situation, because light may propagate laterally to the sensor 320, the sensor 320 does not need to be completely located in a position corresponding to the first display region 11.

For example, by arranging the first pixel circuit 412 in the second display region 12 and enable the sensor 320 to overlap with the first display region 11 in the normal direction of the display surface of the display substrate 01, the shielding effect, caused by the elements in the first display region 11, on the light that is incident onto the first display region 11 and irradiates the sensor 320 can be reduced, so that a signal-to-noise ratio of an image output by the sensor 320 can be increased. For example, the first display region 11 is referred to as a high light-transmission region of the low-resolution region of the display substrate 01.

For example, the sensor 320 may be an image sensor, the image sensor is configured to collect an image of an external environment towards which a light-collecting surface of the sensor 320 faces; the sensor 320 may also be, for example, a Complementary Metal Oxide Semiconductor (CMOS) image sensor or a Charge Coupled Device (CCD) image sensor. The sensor 320 may also be an infrared sensor, a distance sensor, etc. For example, in the case where the display device 30 is a mobile terminal such as a mobile phone, a laptop computer, etc., the sensor 320 may be implemented as a camera of the mobile terminal such as the mobile phone, the laptop computer, etc., and may further includes optical devices, for example, a lens, a reflector, or an optical waveguide, in order to modulate an optical path. For example, the sensor 320 includes photosensitive pixels arranged in an array. For example, each photosensitive pixel includes a photosensitive detector (e.g., a photodiode, a phototransistor) and a switching transistor (e.g., a switching thin film transistor). For example, the photodiode converts an optical signal irradiating thereon into an electrical signal, and the switching transistor is electrically connected with the photodiode to control whether the photodiode is in a state of collecting the optical signal and control the time period of collecting the optical signal.

In some examples, the anode of the first light-emitting element 411 adopts a ITO/Ag/ITO laminate structure, in this situation, in the first display region 11, only the anode of the first light-emitting element 411 is opaque to light, that is, the wire for driving the first light-emitting element 411 (e.g., the above-described signal transmission line 110), and the wire that is insulated from the first light-emitting element 411 (e.g., the first dummy wire 121 or the second dummy wire 122 as described above) are set to be transparent wires. In this case, not only can light transmittance of the first display region 11 be further increased, but also uniformity and consistency of light passing through the first display region 11 are increased, which further reduces or avoids problems such as light reflection that may occur when the sensor 320 receives light, thereby enabling the sensor 320 to accurately implement operations such as image capture, distance sensing, light intensity sensing, etc., and further increasing performance of the display device 30 (e.g., a full-screen display device).

It should be noted that, in the embodiments of the present disclosure, the display device 30 may further include more components and structures, which will not be limited by the embodiment of the present disclosure. The above description of the display substrate 01 may be referred to for technical effects and detailed description of the display device 30, and no details will be repeated here.

For example, the above-described display device 30 is a display substrate, a display panel, an electronic paper, a mobile phone, a tablet personal computer, a television, a monitor, a laptop computer, a digital photo frame, a navigator, and any other product or component having a display function, which will not be limited by the embodiments of the present disclosure.

The specific description and technical effects of the display device 30 provided by the embodiment of the present disclosure may look for the corresponding content about the display substrate provided by the embodiment of the present disclosure for references, for example, the corresponding content about the display substrate 01 according to the above-described embodiments.

The following statements should be noted:
(1) the accompanying drawings involve only the structure(s) in connection with the embodiment(s) of the present disclosure, and other structure(s) can be referred to general design(s).
(2) for the purpose of clarity, in accompanying drawings for illustrating the embodiment(s) of the present disclosure, the thickness and size of a layer or a region are not drawn according to an actual scale but are exaggerated or diminished. However, it should be understood that, in the case that an element such as a layer, a film, a region, a substrate and the like is referred to be "on" or "under" another element, the element may be "directly" disposed "on" or "under" another element, or there may be an intermediate element interposed therebetween.
(3) the embodiments of the present disclosure and the features therein can be combined with each other to obtain new embodiments in the absence of conflicts.

What is described above is only exemplary embodiments of the present disclosure and not limitative on the protection scope of the present disclosure; any changes or replacements that those skilled in the art can easily think of within the technology scope disclosed herein shall be covered by the protection scope of the present disclosure. Thus, the protection scope of the present disclosure shall be defined by the protection scope of the claims.

The invention claimed is:

1. A display substrate, having a first side for display and a second side opposite to the first side and comprising a display region;
   wherein the display region comprises a first display region and a second display region; the second display region at least partially surrounds the first display region; and the first display region and the second display region do not overlap with each other;
   the first display region comprises at least one first light-emitting element, and the first display region allows light from the first side to be at least partially transmitted to the second side; the second display region comprises at least one first pixel circuit, and the at least one first light-emitting element is electrically connected with the at least one first pixel circuit;
   the display substrate is provided with at least one signal transmission line and at least one first dummy wire;
   at least portion of the at least one signal transmission line is located in the first display region and the second display region, and the at least one first light-emitting element is connected with the at least one first pixel circuit through the at least one signal transmission line,
   at least portion of the at least one first dummy wire is located in the first display region and is insulated from the at least one signal transmission line and the at least one first light-emitting element,
   the at least one signal transmission line and the at least one first dummy wire respectively extend along a first direction; and an orthographic projection of the at least one first dummy wire on a plane parallel to the display substrate and an orthographic projection of the at least one signal transmission line on the plane parallel to the display substrate are at least partially staggered.

2. The display substrate according to claim 1, wherein the at least one first dummy wire and the at least one signal transmission line are located in a same layer.

3. The display substrate according to claim 1, wherein the at least one first dummy wire and the at least one signal transmission line both extend along a straight line and are parallel to each other.

4. The display substrate according to claim 1, wherein the at least one first dummy wire comprises a plurality of first dummy wires; and the plurality of first dummy wires are arranged along a second direction different from the first direction and are configured to receive a first voltage signal,
   the display substrate further comprises at least one second dummy wire, the at least one second dummy wire extends along the second direction and is electrically connected with the plurality of first dummy wires, so that the plurality of first dummy wires are electrically connected with each other to receive the first voltage signal.

5. The display substrate according to claim 4, wherein at least one of the plurality of first dummy wires is electrically connected with a first power line through a via hole structure, and the first power line is configured to supply the first voltage signal.

6. The display substrate according to claim 4, wherein the at least one second dummy wire and the at least one first dummy wire are located in a same layer, or the at least one second dummy wire and the at least one first dummy wire are located in different film layers, and the different film layers are insulated from each other at a position where no via hole is provided.

7. The display substrate according to claim 4, wherein the at least one signal transmission line comprises a plurality of signal transmission lines arranged along the second direction, the plurality of signal transmission lines and the plurality of first dummy wires constitute a wiring array;

one of the plurality of signal transmission lines serves as a line unit in the wiring array, and one of the plurality of first dummy wires serves as a line unit in the wiring array; and distances from at least one line unit in the wiring array to two adjacent line units respectively in the second direction are equal.

8. The display substrate according to claim 7, wherein the first display region comprises a middle region and a peripheral region located on both sides of the middle region in the first direction, a central axis of the first display region is located in the middle region, and the peripheral region is adjacent to the second display region;

a per unit area distribution ratio of the plurality of first dummy wires in the middle region is greater than a per unit area distribution ratio of the plurality of first dummy wires in the peripheral region.

9. The display substrate according to claim 4, wherein the at least one signal transmission line, the at least one first dummy wire and the at least one second dummy wire each includes a transparent electrically conductive wire.

10. The display substrate according to claim 1, wherein a width of the at least one first dummy wire in a second direction different from the first direction is equal to a width of the at least one signal transmission line in the second direction.

11. The display substrate according to claim 1, wherein the at least one signal transmission line is electrically connected with an anode of the at least one first light-emitting element through a via hole structure, and the via hole structure at least penetrates through an insulating layer located between the at least one signal transmission line and the anode of the at least one first light-emitting element.

12. The display substrate according to claim 11, wherein an orthographic projection of the via hole structure on the plane parallel to the display substrate and an orthographic projection of the at least one first dummy wire on the plane parallel to the display substrate do not overlap with each other.

13. The display substrate according to claim 1, wherein the at least one first pixel circuit comprises a thin film transistor, and the thin film transistor comprises a gate electrode, a first electrode and a second electrode, the at least one signal transmission line is electrically connected with the first electrode or the second electrode of the thin film transistor.

14. The display substrate according to claim 13, further comprising a source-drain metal layer, wherein:

the first electrode and the second electrode of the thin film transistor are located in the source-drain metal layer; and the anode of the at least one first light-emitting element is located above the source-drain metal layer, a film layer where the at least one signal transmission line and the at least one first dummy wire are located is located between the anode of the at least one first light-emitting element and the source-drain metal layer.

15. The display substrate according to claim 1, wherein the display region further comprises a third display region, the third display region at least partially surrounds the second display region; the first display region, the second display region and the third display region do not overlap with each other;

the second display region further includes at least one second light-emitting element and at least one second pixel circuit; the at least one second light-emitting element is electrically connected with the at least one second pixel circuit;

the third display region includes at least one third light-emitting element and at least one third pixel circuit; and the at least one third light-emitting element is electrically connected with the at least one third pixel circuit.

16. The display substrate according to claim 15, wherein the at least one first light-emitting element, the at least second light-emitting element and the third light-emitting element each comprises an organic light emitting diode.

17. The display substrate according to claim 15, wherein the at least one first light-emitting element comprises a plurality of first light-emitting elements; the at least one second light-emitting element comprises a plurality of second light-emitting elements; and the at least one third light-emitting element comprises a plurality of third light-emitting elements, a per unit area distribution ratio of the plurality of first light-emitting elements in the first display region is less than or equal to a per unit area distribution ratio of the plurality of second light-emitting elements in the second display region;

a per unit area distribution ratio of the plurality of second light-emitting elements in the second display region is less than a per unit area distribution ratio of the plurality of third light-emitting elements in the third display region.

18. The display substrate according to claim 1, wherein the first display region has a region that is covered by the orthographic projection of the at least one signal transmission line on the plane parallel to the display substrate and covered by the orthographic projection of the at least one first dummy wire on the plane parallel to the display substrate, a ratio of an area of the region to an area of the first display region is 70% to 95%.

19. A display device, comprising a display substrate, wherein the display substrate has a first side for display and a second side opposite to the first side and comprises a display region;

the display region comprises a first display region and a second display region; the second display region at least partially surrounds the first display region; and the first display region and the second display region do not overlap with each other;

the first display region comprises at least one first light-emitting element, and the first display region allows light from the first side to be at least partially transmitted to the second side;

the second display region comprises at least one first pixel circuit, and the at least one first light-emitting element is electrically connected with the at least one first pixel circuit;

the display substrate is provided with at least one signal transmission line and at least one first dummy wire;

at least portion of the at least one signal transmission line is located in the first display region and the second display region, and the at least one first light-emitting element is connected with the at least one first pixel circuit through the at least one signal transmission line, at least portion of the at least one first dummy wire is located in the first display region and is insulated from the at least one signal transmission line and the at least one first light-emitting element, the at least one signal transmission line and the at least one first dummy wire respectively extend along a first direction; and an orthographic projection of the at least one first dummy wire on a plane parallel to the display substrate and an orthographic projection of the at least one signal transmission line on the plane parallel to the display substrate are at least partially staggered.

20. The display device according to claim 19, further comprising a sensor, wherein the sensor is located on the second side of the display substrate and is configured to receive light from the first side of the display substrate, wherein an orthographic projection of the sensor on the display substrate at least partially overlaps with the first display region.

* * * * *